(12) United States Patent
Kwon

(10) Patent No.: US 11,532,631 B2
(45) Date of Patent: Dec. 20, 2022

(54) SEMICONDUCTOR DEVICE AND METHOD FOR FABRICATING THE SAME

(71) Applicant: SK hynix Inc., Gyeonggi-do (KR)

(72) Inventor: Se Han Kwon, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 17/152,003

(22) Filed: Jan. 19, 2021

(65) Prior Publication Data

US 2022/0013526 A1 Jan. 13, 2022

(30) Foreign Application Priority Data

Jul. 9, 2020 (KR) ........................ 10-2020-0084606

(51) Int. Cl.
| | | |
|---|---|---|
| *H01L 27/108* | (2006.01) | |
| *H01L 23/535* | (2006.01) | |
| *H01L 23/532* | (2006.01) | |
| *H01L 21/768* | (2006.01) | |

(52) U.S. Cl.
CPC .. *H01L 27/10855* (2013.01); *H01L 21/76805* (2013.01); *H01L 21/76895* (2013.01); *H01L 23/535* (2013.01); *H01L 23/5329* (2013.01); *H01L 23/53257* (2013.01); *H01L 27/10814* (2013.01)

(58) Field of Classification Search
CPC ......... H01L 27/10814; H01L 27/10855; H01L 21/76805; H01L 21/76895; H01L 23/53257; H01L 23/5329; H01L 23/535; H01L 21/76847; H01L 21/76849; H01L 21/76831; H01L 21/76897; H01L 27/10885; H01L 27/108; H01L 23/5386; H01L 27/10844; H01L 27/10808; H01L 27/10873

See application file for complete search history.

(56) References Cited

U.S. PATENT DOCUMENTS

| | | | |
|---|---|---|---|
| 9,178,026 B2 | 11/2015 | Seo | |
| 10,008,505 B2 | 6/2018 | Lee et al. | |
| 2015/0061134 A1* | 3/2015 | Lee | H01L 21/7682 257/751 |

* cited by examiner

*Primary Examiner* — Thanhha S Pham
(74) *Attorney, Agent, or Firm* — IP & T Group LLP

(57) ABSTRACT

A semiconductor device and method for fabricating the semiconductor device, which secure an overlay margin between the storage node and the storage node contact plug, as well as a processing margin, by excluding the connecting structure between the storage node and the storage node contact plug. A semiconductor device comprises a storage node contact hole provided between bit line structures, a first plug filling a lower portion of the storage node contact hole, a second plug protruding from the first plug, an insulation layer spacer covering a side wall of the second plug, and a storage node positioned at a higher level than the second plug and including an extension contacting another side wall of the second plug and a portion of a top surface of the first plug.

11 Claims, 15 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2020-0084606, filed on Jul. 9, 2020, which is herein incorporated by reference in its entirety.

BACKGROUND

1. Field

Embodiments of the present disclosure relate generally to a semiconductor device and a method for fabricating the same, and more specifically, a semiconductor device including storage nodes and a method for fabricating the semiconductor device.

2. Description of the Related Art

As semiconductors become more integrated, a difficulty arises in securing an overlay margin between the storage node and the storage node contact plug. Typically, to secure the overlay margin, a connecting structure (e.g., storage node contact plug 2 (SNC2)) is formed between the storage node and the storage node contact plug. However, this requires high-cost EUV equipment and use of processing technology which is rather difficult to carry out. Moreover, the connection structure also has a small processing margin and, thus, an overlay failure is likely to occur between the storage node and the storage node contact plug. Therefore, new solutions are highly desirable.

SUMMARY

According to various embodiments of the present disclosure, there is provided a semiconductor device and method for fabricating the semiconductor device, which can secure an overlay margin between the storage node and the storage node contact plug, as well as a processing margin. The semiconductor device and fabricating method thereof exclude the connecting structure between the storage node and the storage node contact plug.

According to an embodiment, a semiconductor device comprises a storage node contact hole provided between bit line structures, a first plug filling a lower portion of the storage node contact hole, a second plug protruding from the first plug, an insulation layer spacer covering a side wall of the second plug, and a storage node positioned at a higher level than the second plug and including an extension contacting another side wall of the second plug and a portion of a top surface of the first plug.

According to another embodiment, a semiconductor device comprises a storage node contact hole provided between bit line structures, a first plug filling a lower portion of the storage node contact hole, a second plug protruding from the first plug, an insulation layer spacer partially covering a side wall of the second plug and partially exposing the side wall of the second plug, and an extension contacting the exposed side wall of the second plug.

According to yet another embodiment, a method for fabricating a semiconductor device comprises forming a storage node contact hole between bit line structures, forming a first plug filling a lower portion of the storage node contact hole, forming insulation layer spacers covering side walls of the storage node contact hole and a second plug filling a rest of the storage node contact hole between the insulation layer spacers, on the first plug, forming a sacrificial layer on the second plug, the insulation layer spacers, and the bit line structures, forming a storage node hole through the sacrificial layer, recessing the insulation layer spacers exposed by the storage node hole, and forming a storage node in the storage node hole.

According to yet another embodiment, a semiconductor device comprises a storage node contact plug provided between bit line structures, the storage node contact plug including a first plug and a second plug positioned on top of the first plug, an insulation layer spacer covering a first side wall of the second plug, a storage node including an upper part and an extension protruding from the upper part, wherein the extension covers a second side wall of the second plug.

Wherein the second plug has a smaller cross-section than the first plug, wherein the insulation layer spacer is contacting a first portion of a top surface of the first plug that is not covered by the second plug, and wherein the extension covers a second portion of the top surface of the first plug that is not covered by the second plug. The present invention is advantageous over existing art because it makes it possible to secure an overlay margin between the storage node and the storage node contact plug, as well as a processing margin, by excluding the connecting structure between the storage node and the storage node contact plug. Thus, semiconductor devices with enhanced reliability are now possible.

These and other features and advantages of the present invention will become better understood from the following figures and detailed description.

DETAILED DESCRIPTION

Figure 1:
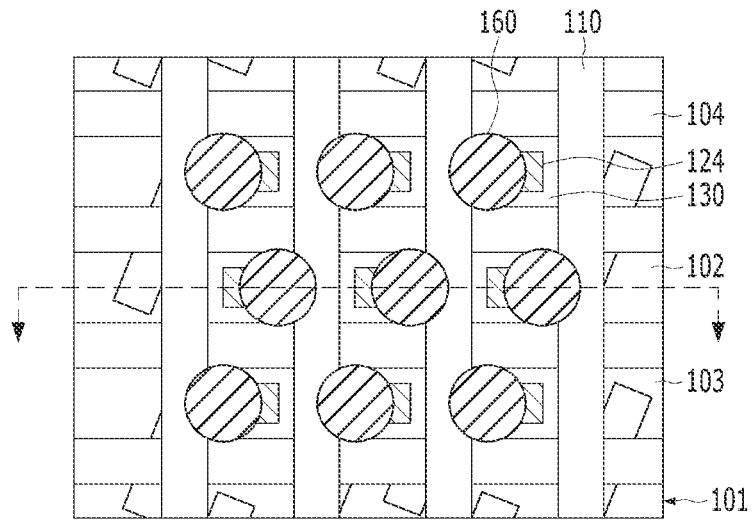
FIG. 1 is a plan view illustrating a semiconductor device according to an embodiment of the present disclosure.

Hereinafter, embodiments of the disclosure are described with reference to schematic cross-sectional views, plan views, or block diagrams. Changes or modifications may be made to the views depending on manufacturing techniques and/or tolerances. Thus, embodiments of the disclosure are not limited to specific types as shown and illustrated herein but may encompass changes or modifications resultant from fabricating processes. For example, the regions or areas shown in the drawings may be schematically shown, and their shapes shown are provided merely as examples, and should not limit the category or scope of the disclosure. It should be also understood that the drawings are simplified schematic illustrations of the described devices and may not include well known details for avoiding obscuring the features of the invention.

It should also be noted that features present in one embodiment may be used with one or more features of another embodiment without departing from the scope of the invention.

FIG. 1 is a plan view illustrating a semiconductor device according to an embodiment of the present disclosure. FIGS. 2 to 9 are cross-sectional views illustrating semiconductor devices according to various embodiments of the present disclosure. FIGS. 2 to 9 are cross-sectional views as viewed in the direction of the arrow of FIG. 1.

FIGS. 3 to 9 are enlarged views illustrating the structural characteristics of a storage node contact plug and a storage node of a semiconductor device. The other structures than the storage node contact plug and the storage node shown in FIGS. 3 to 9 may be identical to those of FIG. 2.

Figure 2:
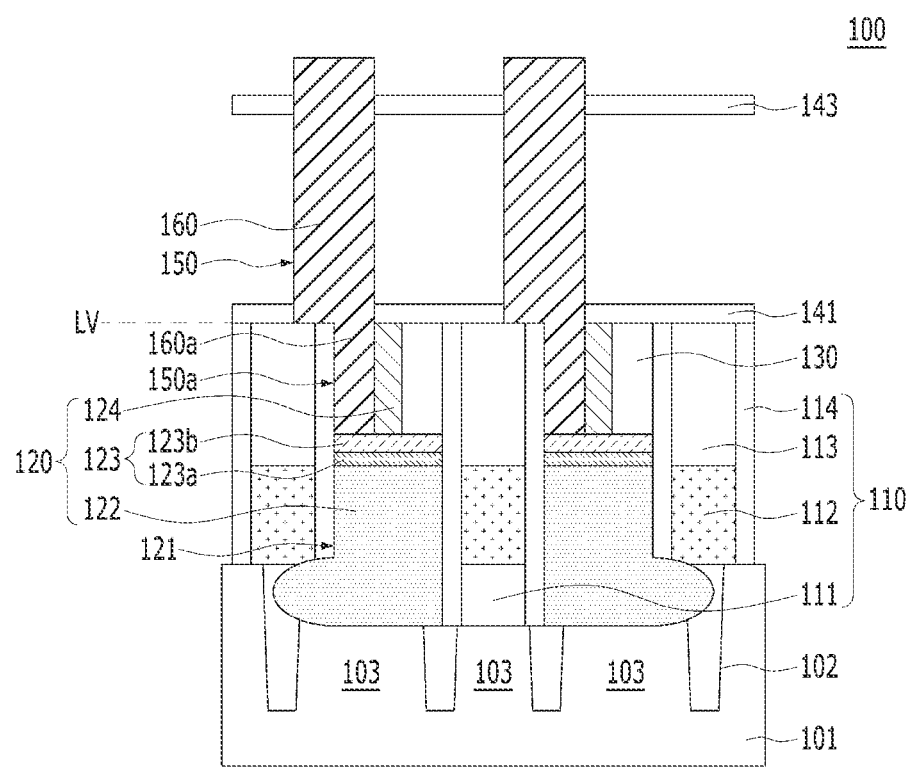
FIGS. 2, 3, 4, 5, 6, 7, 8, and 9 are cross-sectional views illustrating semiconductor devices according to various embodiments of the present disclosure.

As shown in FIGS. 1 and 2, a semiconductor device 100 may include a storage node contact hole 121 provided between bit line structures 110 and a storage node contact plug 120 filling the storage node contact hole 121. The storage node contact plug 120 may include a first plug 122 and 123 filling a lower portion of the storage node contact hole 121 and a second plug 124 protruding from the first plug 122 and 123. The semiconductor device 100 may include an insulation layer spacer 130 covering a side wall of the second plug 124 and a storage node 160 including an extension 160a. The extension 160a may have a smaller cross-section than the remaining of the storage node 160 which may be referred to as an upper part of the storage node 160. The extension 160a is contacting the opposite side wall of the second plug 124 and a portion of the top surface of the first plug 122 and 123. The storage node 160 has a top surface positioned at a higher level than the second plug 124.

The semiconductor device 100 may be part of a memory cell (also referred to simply as a cell). For example, the semiconductor device 100 may be part of a dynamic random-access memory (DRAM) memory cell.

A substrate 101 may include a material suitable for semiconductor processing. The substrate 101 may include a semiconductor substrate. The substrate 101 may be formed, for example, of a silicon-containing material. The substrate 101 may include, for example, silicon monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The substrate 101 may include other semiconductor material, e.g., germanium. The substrate 101 may include a compound semiconductor substrate, e.g., a group-III/V semiconductor substrate, such as of GaAs. The substrate 101 may include a silicon-on-insulator (SOI) substrate.

An element separation layer 102 and active areas 103 may be formed in the substrate 101. The active areas 103 may be defined by the element separation layer 102. The element separation layer 102 may be a shallow trench isolation (STI) area formed by trench etching. The element separation layer 102 may include, for example, a silicon oxide, a silicon nitride, or a combination thereof.

A gate structure 104 may be formed which extends on the substrate 101 in a shorter-axis direction of the active area 103. The gate structure 104 may include a buried gate structure positioned at a lower level than the top surface of the substrate 101.

The bit line structure 110 may extend in a longer-axis direction of the active area 103. The bit line structure 110 may cross the gate structure 104. The bit line structure 110 and the gate structure 104 may be perpendicular to each other. The bit line structure 110 may include a vertical stacked structure of a bit line contact 111, a bit line 112, and a bit line hard mask 113. The bit line structure 110 may further include a bit line spacer 114 covering the side wall of the vertical stacked structure of the bit line structure 110.

The bit line contact 111 and the bit line 112 may include a metal-containing material. The bit line 112 may include metal, metal nitride, metal silicide, or a combination thereof. The bit line 112 may include, for example, tungsten (W). According to an embodiment, the bit line 112 may include, for example, a stacked structure (TiN/W) of ruthenium (Ru), molybdenum (Mo), or titanium nitride and tungsten. The titanium nitride may function as a barrier. The bit line hard mask 113 may include an insulation material. The bit line hard mask 113 may include, for example, silicon oxide or silicon nitride. The bit line spacer 114 may be formed in a multi-layer structure. The bit line spacer 114 may include, for example, silicon oxide, silicon nitride, or a combination thereof.

The bottom surface of the storage node contact hole 121 may be positioned at a lower level than the bottom surface of the bit line structure 110. In particular, the width of the bottom of the storage node contact hole 121 which is positioned at a lower level than the bottom surface of the bit line structure 110 may be larger than the width of the top of the storage node contact hole 121.

The storage node contact plug 120 may include a first plug 122 and 123 filling a lower portion of the storage node contact hole 121 and a second plug 124 protruding from the first plug 122 and 123.

The first plug 122 and 123 may include a multi-layer structure. The first plug 122 and 123 may include a multi-layer structure of different conductive materials. A lower portion 122 of the first plug may include a silicon-containing material. The lower portion 122 of the first plug may include, for example, polysilicon. An upper portion 123 of the first plug may include a metal-containing material. The upper portion 123 of the first plug may include, for example, a stacked structure of metal silicide 123a and a metallic material 123b. The metal silicide 123a may include, for example, cobalt silicide (CoSix). The metallic material 123b may include, for example, titanium nitride (TiN) or tungsten (W). According to another embodiment, the upper portion 123 of the first plug may include a single-layer structure of metal silicide.

The second plug 124 may include a metallic material. The metallic material may include, for example, titanium nitride or tungsten.

The width of the second plug 124 may be smaller than the width of the first plug 122 and 123. The second plug 124 may protrude from the first plug 122 and 123, in a vertical direction away from the substrate 101. Two opposite side walls of the second plug 124 may be spaced apart from side walls of the storage node contact hole 121. The two opposite side walls of the second plug 124 may be spaced apart, by the same distance, from two opposite side walls of the storage node contact hole 121.

The insulation layer spacer 130 may cover a side wall of the second plug 124. The insulation layer spacer 130 may fill the gap between one side wall of the second plug 124 and the side wall of the storage node contact hole 121, which faces the side wall of the second plug 124. The insulation layer spacer 130 may include, for example, silicon oxide or silicon nitride.

The top surface of the bit line structure 110, the top surface of the second plug 124, and the top surface of the insulation layer spacer 130 may be positioned at the same level LV.

The storage node 160 may include the extension 160a, a portion of the bottom surface of which contacts the top surface of the first plug 122 and 123. The extension 160a may be a portion of the storage node 160, which is positioned at a lower level than the top surface LV of the bit line structure 110. The rest of the storage node 160 except for the extension 160*a* may be positioned at a higher level than the top surface of the bit line structure 110 and its bottom surface may contact the top surface of the bit line structure 110. The extension 160*a* may extend from the storage node 160, and its bottom surface may contact the top surface of the first plug 122 and 123. The two side walls of the extension 160*a* may contact the other side wall of the second plug 124 and the side wall of the storage node contact hole 121, which faces the other side wall of the second plug 124, respectively. As the extension 160*a* is buried between the second plug 124 and the storage node contact hole 121, the effect of preventing the storage node 160 from bending or leaning may be maximized.

The storage node 160 including the extension 160*a* may be aligned with the other side wall of the second plug 124. The storage node 160 may have a pillar shape.

An etch stop layer 141 may be positioned on the top surface of the bit line structure 110 between the storage nodes 160. The etch stop layer 141 may include an insulation material.

A support 143 may be positioned between the storage nodes 160. The support 143 may be provided for preventing the storage node 160 from bending or leaning and may be a structure to connect adjacent storage nodes 160. The support 143 may be placed in a position appropriate for preventing the storage node 160 from leaning. The support 143 may be spaced apart from the etch stop layer 141 in the direction perpendicular to the substrate 101, with a space left therebetween. The support 143 may include an insulation material. The support 143 may include a single-layer or multi-layer structure. The top surface of the support 143 may be positioned at a lower level than the top surface of the storage node 160. According to another embodiment, the top surface of the support 143 may be positioned at the same level as the top surface of the storage node 160. According to yet another embodiment, a plurality of supports 143 may be formed which are spaced apart by a predetermined distance from the substrate 101 in the direction perpendicular to the substrate 101. Alternatively, the support 143 may be omitted.

Figure 3:
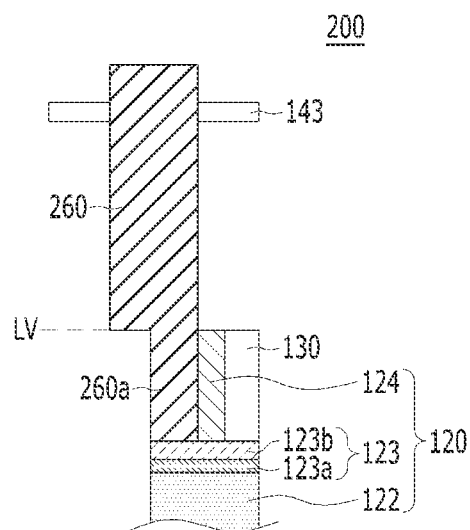

As shown in FIG. 3, a semiconductor device 200 may be configured so that two opposite side walls of the second plug 124 are spaced apart by different distances from two opposite side walls of the storage node contact hole 121. Specifically, the gap between the second plug 124 and the side wall of the storage node contact hole 121, which is filled with the insulation layer spacer 130, may be smaller than the gap between the second plug 124 and the side wall of the storage node contact hole 121, where the extension 160*a* of the storage node 160 is buried. The top surface of the second plug 124 may be positioned at the same level LV as the top surface of the bit line structure 110.

Figure 4:
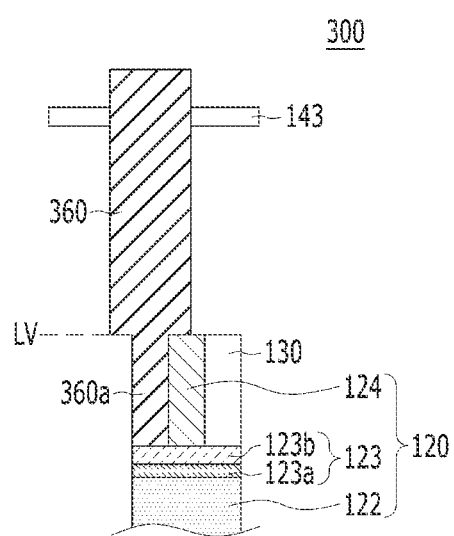

As shown in FIG. 4, a semiconductor device 300 may be structured so that the storage node 360 may not be aligned with any of the side walls of the second plug 124. The storage node 360 may be aligned in various positions within a range in which it may contact the extension 360*a* but does not contact its adjacent storage node contact plug 120. The top surface of the second plug 124 may be positioned at the same level LV as the bit line structure 110.

According to another embodiment, as the storage node 360 is so aligned, the second plug 124 may be positioned to be spaced apart by different distances from the two opposite side walls of the storage node contact hole 121 as in the semiconductor device 200 of FIG. 3.

Figure 5:
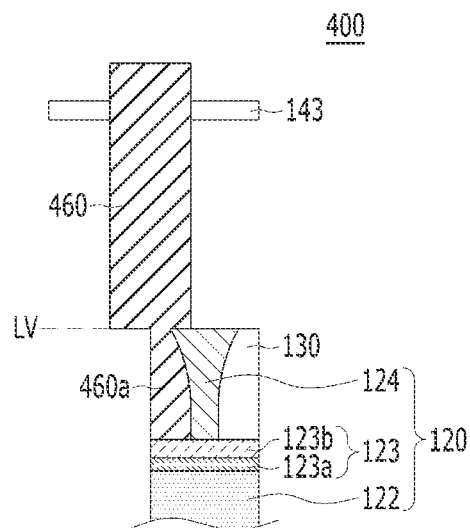

As shown in FIG. 5, a semiconductor device 400 may be formed so that the width of the top of the second plug 124 is larger than the width of the bottom of the second plug 124. A portion of the bottom surface of the storage node 460, except for the extension 460*a*, may contact the respective top surfaces of the bit line structure 110 and the second plug 124. In an embodiment, in addition to the extension 460*a* which is contacting the side of the second plug 124, a portion of the bottom surface of the upper part of the storage node 460 is in contact with the top surfaces of the bit line structure 110 and the second plug 124. The width of the top of the second plug 124 may be adjusted within a range in which the conductive material for forming the extension 460*a* may be easily buried. The top surface of the second plug 124 may be positioned at the same level LV as the bit is line structure 110.

According to another embodiment, the alignment of the storage node 460 and the position of the second plug 124 may be varied as shown in FIGS. 3 and 4.

Figure 6:
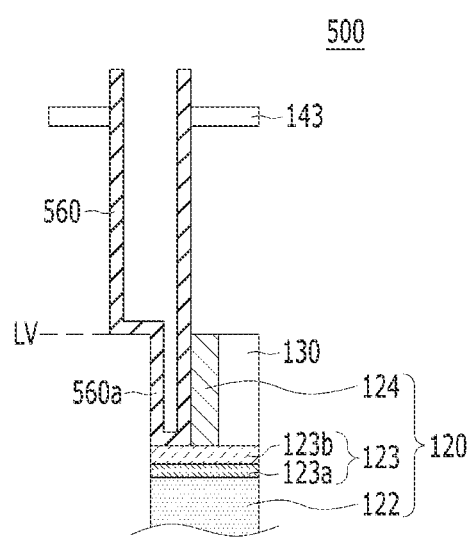

As shown in FIG. 6, a semiconductor device 500 may include a cylinder-shaped storage node 560 including a cylinder-shaped upper part and a cylinder-shaped extension 560*a*. The upper part of the storage node 560 is, as defined earlier with respect to FIG. 2, storage node 560 except the extension 560*a*. The top surface of the second plug 124 may be positioned at the same level LV as the bit line structure 110.

According to another embodiment, the alignment of the storage node 560 and the position of the second plug 124 may be varied as shown in FIGS. 3 and 4.

Figure 7:
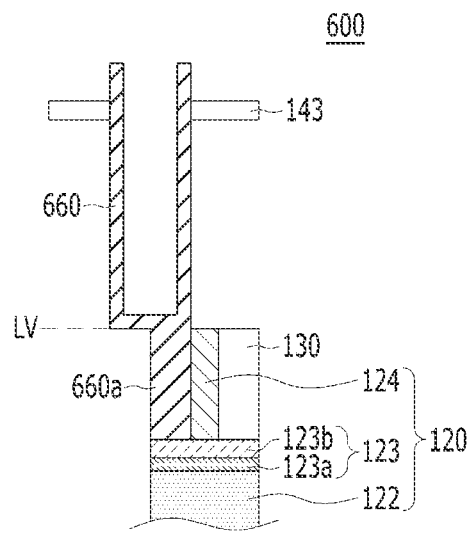

As shown in FIG. 7, a semiconductor device 600 may include a hybrid shape storage node 660 including a cylinder-shaped upper part and a pillar-shaped extension 660*a*. The top surface of the second plug 124 may be positioned at the same level LV as the bit line structure 110.

According to another embodiment, the alignment of the storage node 660 and the position of the second plug 124 may be varied as shown in FIGS. 3 and 4.

Figure 8:
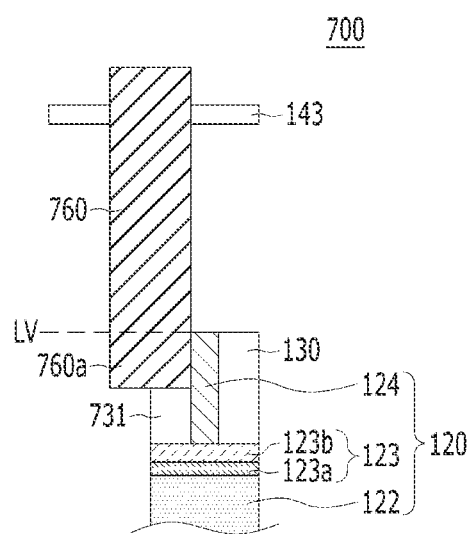

As shown in FIG. 8, a semiconductor device 700 may include a storage node 760 including an extension 760*a* which has the same width as the upper part of the storage node 760. The extension 760*a* may partially cover a side wall of the second plug 124. A portion of the bottom surface of the extension 760*a* may contact the top surface of the second portion 731 of the insulation layer spacer. In other words, the storage node 760 may include the extension 760*a* which contacts the second portion 731 of the insulation layer spacer, which exposes a portion of the side wall of the second plug 124, and the exposed side wall of the second plug 124. The storage node 760 including the extension 760*a* may have a pillar shape with the same cross-section size along its entire span. The top surface of the second plug 124 may be positioned at the same level LV as the bit line structure 110.

According to another embodiment, the second plug 124 may be aligned in various positions as shown in FIG. 3. The storage node 760 including the extension 760*a* may, for example, have a cylinder shape.

Figure 9:
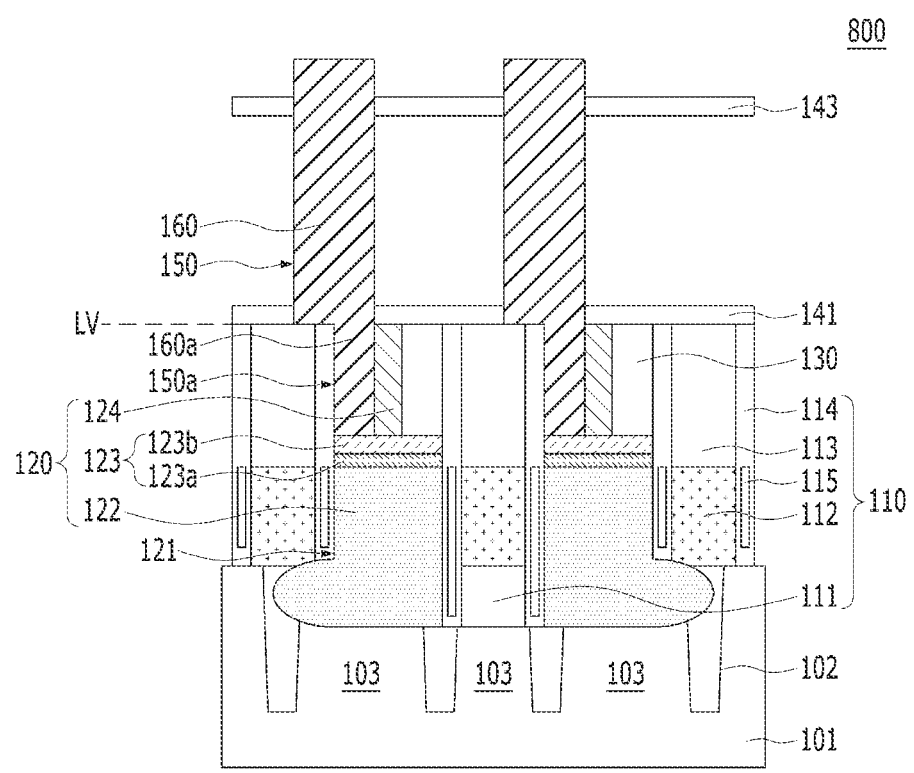

As shown in FIG. 9, a semiconductor device 800 may include an air gap 115 formed within the bit line spacer 114. The top surface of the air gap 115 may be positioned at a lower level than the top surface of the first plug 122 and 123. The air gap 115 may be fully positioned within the bit line spacer 114.

According to another embodiment, the storage node 160, extension 160*a*, and second plug 124 may include various structures described above and shown in FIGS. 3 to 8.

FIGS. 10A to 10J are cross-sectional views for describing a method for fabricating a semiconductor device according to an embodiment. FIGS. 10A to 10J are cross-sectional views for describing a method for fabricating a semiconductor device as shown in FIG. 2.

Figure 10A:
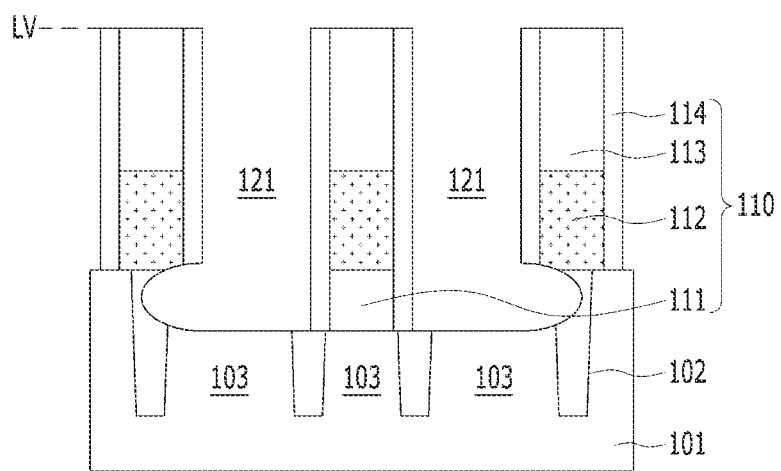
FIGS. 10A, 10B, 10C, 10D, 10E, 10F, 10G, 10H, 10I, and 10J are cross-sectional views for describing a method for fabricating a semiconductor device according to an embodiment of the present disclosure.

Referring to FIG. 10A, bit line structures 110 may be formed on the top of a substrate 101. The storage node contact holes 121 may be provided between the bit line structures 110.

The substrate 101 may include a material suitable for semiconductor processing. The substrate 101 may include a semiconductor substrate. The substrate 101 may be formed, for example, of a silicon-containing material. The substrate 101 may include, for example, silicon monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The substrate 101 may include other semiconductor material, e.g., germanium. The substrate 101 may include a compound semiconductor substrate, e.g., a group-III/V semiconductor substrate, such as of GaAs. The substrate 101 may include a silicon-on-insulator (SOI) substrate.

Thereafter, the element separation layer 102 may be formed on the substrate 101. The active areas 103 may be defined by the element separation layer 102. The element separation layer 102 may be a shallow trench isolation (STI) area formed by trench etching. The element separation layer 102 may include, for example, a silicon oxide, a silicon nitride, or a combination thereof.

Thereafter, the bit line structures 110 may be formed on the substrate 101. Before the bit line structures 110 are formed, gate structures (not shown) may be formed. The gate structures (not shown) may include buried gates.

The bit line structure 110 may include a vertical stacked structure of a bit line contact 111, a bit line 112, and a bit line hard mask 113 and a bit line spacer 114 covering the side wall of the vertical stacked structure.

The bit line contact 111 and the bit line 112 may include a metal-containing material. The bit line 112 may include metal, metal nitride, metal silicide, or a combination thereof. The bit line 112 may include, for example, tungsten (W). According to another embodiment, the bit line 112 may include, for example, a stacked structure (TiN/W) of titanium nitride and tungsten. The titanium nitride may function as a barrier.

The bit line hard mask 113 may include an insulation material. The bit line hard mask 113 may include, for example, silicon oxide or silicon nitride.

The bit line spacer 114 may be formed in a multi-layer structure. The bit line spacer 114 may include, for example, silicon oxide, silicon nitride, or a combination thereof. The bit line spacer 114 may further include an air gap 115 as in the semiconductor device 800 of FIG. 9.

The bottom surface of the storage node contact hole 121 may be positioned at a lower level than the bottom surface of the bit line structure 110. In particular, the width of the bottom of the storage node contact hole 121 which is positioned at a lower level than the bottom surface of the bit line structure 110 may be larger than the width of the top of the storage node contact hole 121. To that end, the storage node contact hole 121 may be formed between the bit line structures 110 and, then, etching may be performed to enlarge the width of the bottom portion.

Figure 10B:
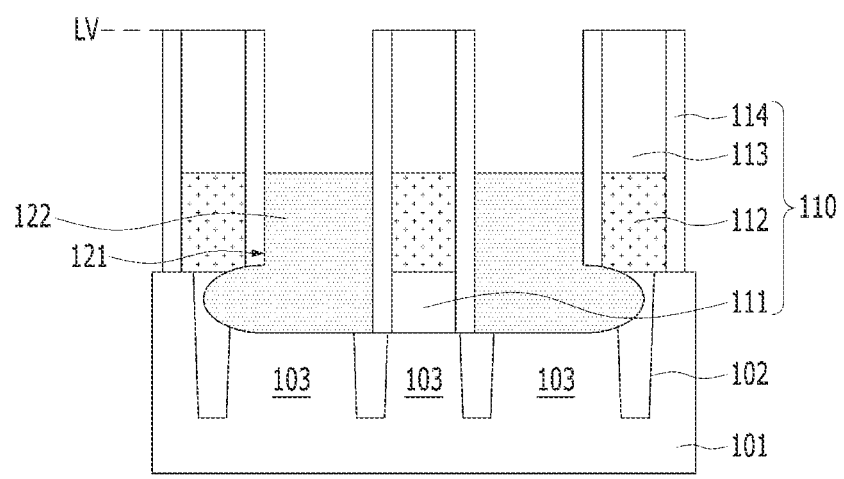

As shown in FIG. 10B, the lower portion of the first plug may be formed to fill the lower portion of the storage node contact hole 121. To form the lower portion 122 of the first plug, a conductive material may be formed to fill the storage node contact hole 121 and, then, a series of processes for recessing the conductive material may be performed. The lower portion 122 of the first plug may include, for example, a silicon-containing material. The lower portion 122 of the first plug may include, for example, polysilicon.

Figure 10C:
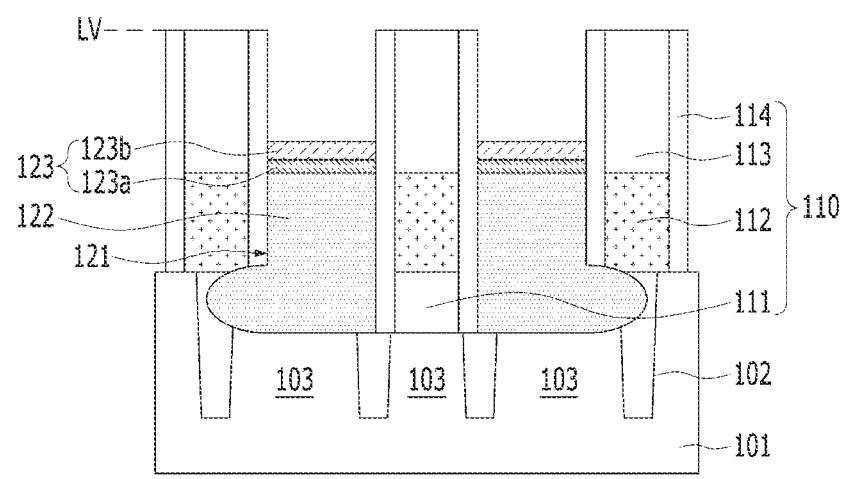

As shown in FIG. 10C, the upper portion 123 of the first plug may be formed on the lower portion 122 of the first plug. The upper portion 123 of the first plug may include a metal-containing material. The upper portion 123 of the first plug may include, for example, a stacked structure of metal silicide 123a and a metallic material 123b. The metal silicide 123a may include, for example, cobalt silicide. The metallic material 123b may include, for example, titanium nitride (TiN) or tungsten (W). According to another embodiment, the upper portion 123 of the first plug may include a single-layer structure of metal silicide 123a.

Figure 10D:
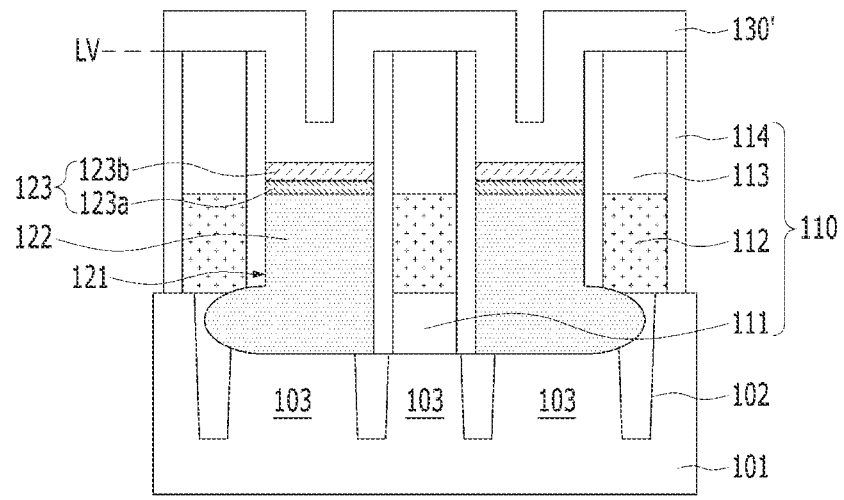
Figure 10E:
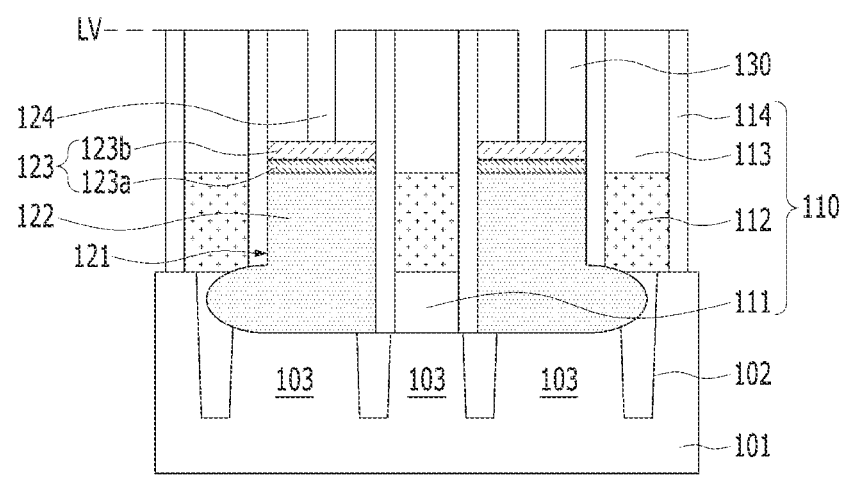

As shown in FIGS. 10D and 10E, an insulation layer 130' may be formed to cover the upper side wall of the storage node contact hole 121 and the top of the first plug 122 and 123. The insulation layer 130' may include, for example, silicon oxide or silicon nitride.

Subsequently, the insulation layer 130' may be etched, forming the insulation layer spacer 130. The etching of the insulation layer 130' may be performed by an etch-back manner. Thus, the insulation layer spacer 130 is formed on the first plug 122 and 123 to cover the side wall of the storage node contact hole 121. When a difference in deposition thickness occurs due to step coverage in the insulating layer 130' forming process illustrated in FIG. 10d, as shown in FIG. 5, the insulation layer spacer 130 may be formed so that its top is smaller in width than its bottom.

Figure 10F:
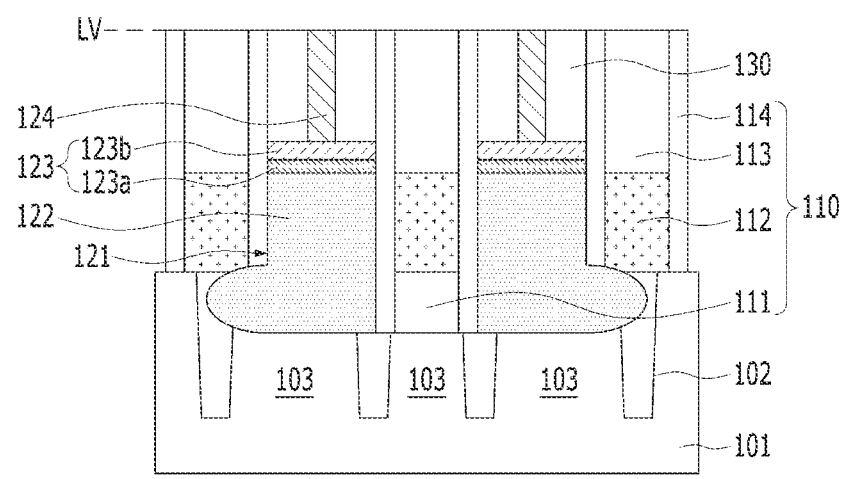

As shown in FIG. 10F, the second plug 124 may be formed on the first plug 122 and 123 between the insulation layer spacers 130 to fill the rest of the storage node contact hole 121. To form the second plug 124, a conductive material may be formed on the first plug 122 and 123 to fill the rest of the storage node contact hole 121, and a series of processes may be performed to etch the conductive material to be positioned at the same level as the top surface of the insulation layer spacer 130. The second plug 124 may include a metallic material. The second plug 124 may include, for example, titanium nitride (TiN) or tungsten (W).

According to another embodiment, the shape and position of the second plug 124 may be varied as in the semiconductor devices of FIGS. 3 and 5.

Figure 10G:
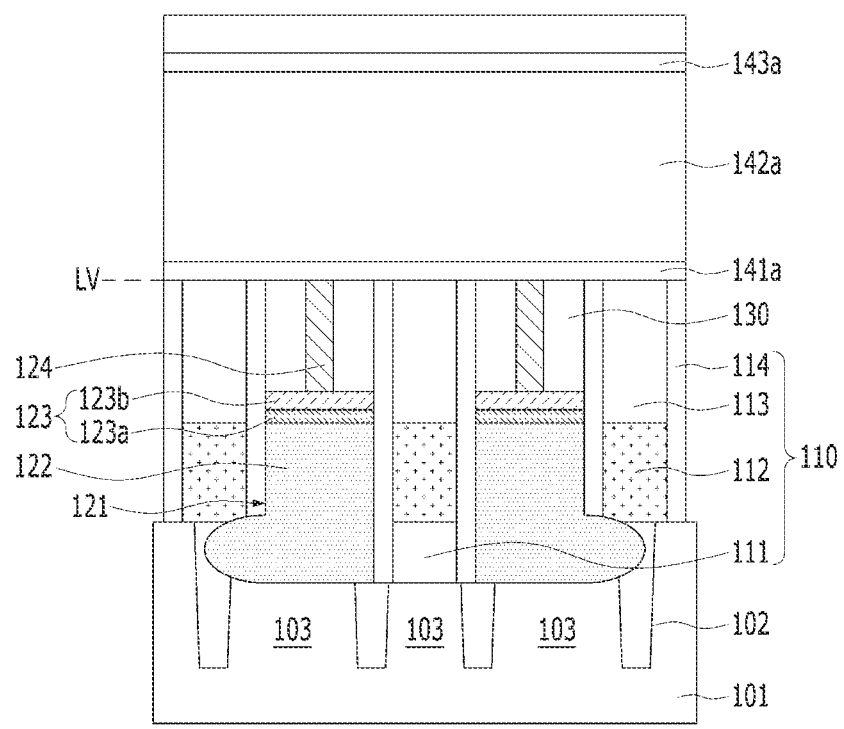

As shown in FIG. 10G, an etch stop layer 141a, a separation layer 142a, and a support 143a may be formed sequentially on the second plug 124, bit line structure 110, and insulation layer spacer 130. The etch stop layer 141a, the separation layer 142a, and the support 143a may include an insulation material. The etch stop layer 141a, separation layer 142a, and support 143a may be formed of materials with different etch selectivities. In particular, the etch stop layer 141a and the support 143a may be formed, for example, of a material with a different wet etch selectivity from that of the separation layer 142a. For example, the etch stop layer 141a and the support 143a may include silicon nitride, and the separation layer 142a may include, for example, silicon oxide.

The support 143a may include a single-layer or multi-layer structure. The support 143a may be interposed between separation layers 142a. According to another embodiment, the support 143a may be formed on the separation layer 142a. According to another embodiment, the support 143a may be formed in the middle of, and on the top of, the separation layer 142. Alternatively, the support 143a may be omitted.

Figure 10H:
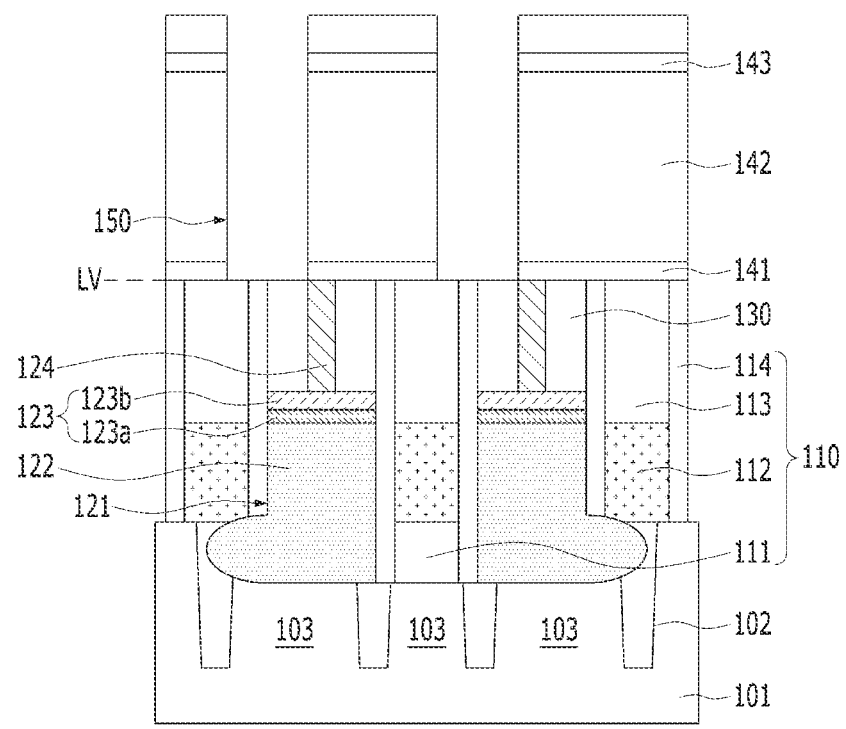

As shown in FIG. 10H, storage node holes 150 may be formed through the etch stop layer 141, the separation layer 142, and the support 143. One side wall of the storage node hole 150 may be vertically aligned with one side wall of the second plug 124. Portions of the insulation layer spacer 130 and the bit line structure 110 may be exposed by the storage node hole 150. According to another embodiment, the storage node hole 150 may not be aligned with one side wall of the second plug 124 as in the semiconductor device of FIG. 4.

Figure 10I:
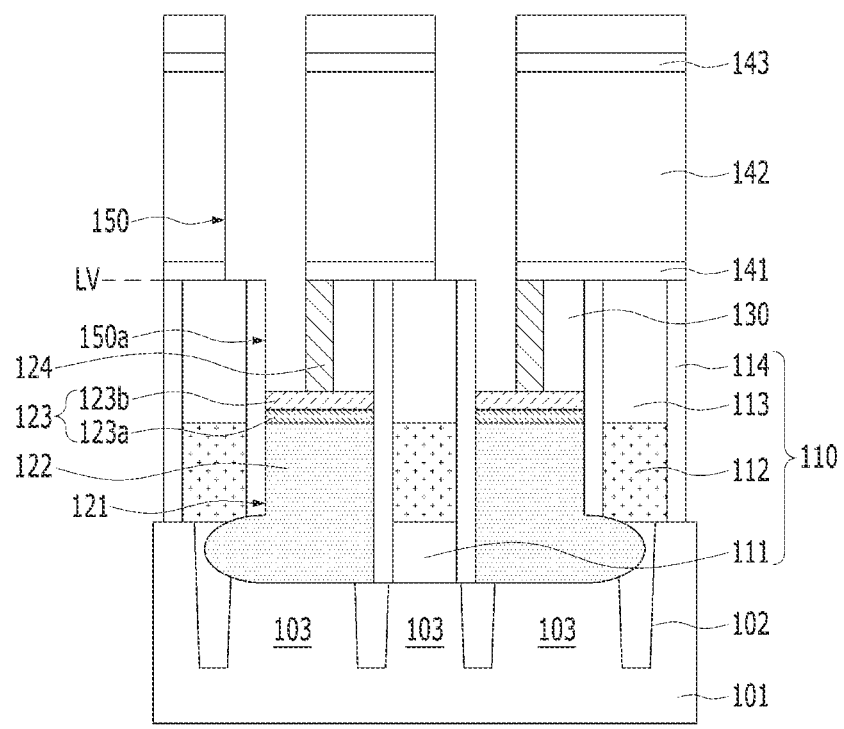

As shown in FIG. 10I, the insulation layer spacer 130 exposed by the storage node hole 150 may be removed, forming a gap 150a. The top surface of the first plug 122 and 123, one side wall of the second plug 124, and one side wall of the storage node contact hole 121, which faces the side wall of the second plug 124, may be exposed by the gap 150a.

According to another embodiment, the gap 150a may be formed to have the same width as the storage node hole 150 as in the semiconductor device of FIG. 8.

Figure 10J:
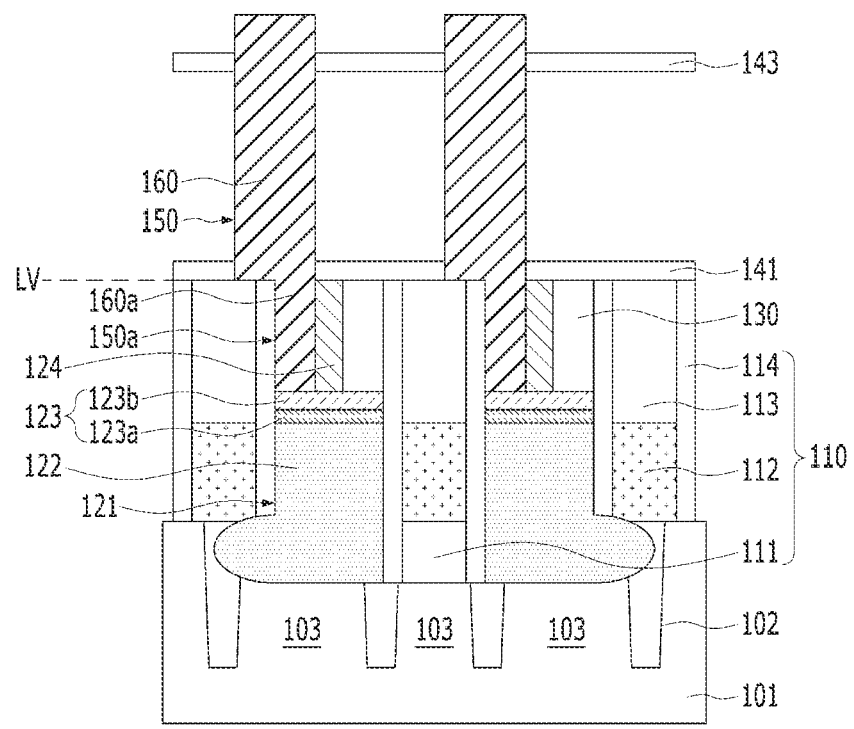

As shown in FIG. 10J, the storage node 160 including the extension 160a may be formed in the storage node hole 150 and the gap 150a. The extension 160a may have a bottom surface positioned at a lower level of the top surface of the second plug 124 and may continuously extend from the storage node 160. The bottom surface of the extension 160a may contact a portion of the top surface of the first plug 122 and 123, and one side wall of the extension 160a may contact one side wall of the second plug 124. In the instant embodiment, a storage node 160 in a pillar shape is shown but, alternatively, a cylinder-shaped storage node may be formed as shown in FIGS. 6 and 7.

As described above, since the extension 160a extending from the storage node 160 is included at a lower level than the top surface of the bit line structure 110, the storage node 160 may be prevented from bending or leaning. Further, a short circuit may be prevented by securing a contact area of the storage node 160 and the storage node contact plug 120 and an overlay margin with the adjacent storage node and storage node contact plug 120 via the extension 160a. Further, as the storage node contact plug 2 (SNC2) which used to be formed at a higher level than the top surface of the bit line structure 110 is omitted, processing steps may be reduced, securing a processing margin and reducing costs. Further, since the storage node contact plug 2 (SNC2) is omitted, defects in the storage node contact plug 2 (SNC2) may be fundamentally prevented.

While various embodiments of the disclosure have been described above, it will be readily appreciated by one of ordinary skill in the art that various changes or modifications may be made thereto without departing from the scope or technical spirit of the disclosure.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are apparent in view of the present disclosure and are intended to fall within the scope of the appended claims.

What is claimed is:

1. A semiconductor device, comprising:
   a storage node contact hole provided between bit line structures;
   a first plug filling a lower portion of the storage node contact hole;
   a second plug protruding from the first plug;
   an insulation layer spacer covering a side wall of the second plug; and
   a storage node positioned at a higher level than the second plug and including an extension contacting another side wall of the second plug and a portion of a top surface of the first plug.

2. The semiconductor device of claim 1, wherein the second plug is smaller in width than the first plug.

3. The semiconductor device of claim 1, wherein the second plug protrudes from the first plug in a vertical direction.

4. The semiconductor device of claim 1, wherein two opposite side walls of the second plug are spaced apart from two opposite side walls of the storage node contact hole.

5. The semiconductor device of claim 1, wherein a top surface of the insulation layer spacer, a top surface of the second plug, and top surfaces of the bit line structures are positioned at the same level.

6. The semiconductor device of claim 1, wherein the bit line structures include a vertical stacked structure of a bit line contact, a bit line, and a bit line hard mask and a bit line spacer covering a side wall of the vertical stacked structure.

7. The semiconductor device of claim 6, wherein the bit line spacer includes an air gap.

8. The semiconductor device of claim 1, wherein the first plug and the second plug include different materials.

9. The semiconductor device of claim 1, wherein the first plug includes a stacked structure of a silicon-containing layer and a metal-containing layer or a stacked structure of a silicon-containing layer, metal silicide, and a metallic material.

10. The semiconductor device of claim 1, wherein the second plug includes a metallic material.

11. The semiconductor device of claim 9, wherein the metallic material includes titanium nitride or tungsten.

\* \* \* \* \*